United States Patent [19]

Sarlo

[11] Patent Number: 4,547,722
[45] Date of Patent: Oct. 15, 1985

[54] TEST PANEL FOR TRACTOR AND TRAILER LIGHTS

[76] Inventor: Thomas J. Sarlo, 1218 N. 19th Ave., Melrose Park, Ill. 60660

[21] Appl. No.: 482,494

[22] Filed: Apr. 6, 1983

[51] Int. Cl.$^4$ ............................................. G01R 31/02
[52] U.S. Cl. ........................................................... 324/51
[58] Field of Search ......................................... 324/51

[56] References Cited

U.S. PATENT DOCUMENTS 3,663,939 5/1972 Olsson ............................. 324/51 X
3,737,767 6/1973 Slutsky ................................. 324/51

Primary Examiner—Stanley T. Krawczewicz
Assistant Examiner—Jack B. Harvey
Attorney, Agent, or Firm—Hill, Van Santen, Steadman & Simpson

[57] ABSTRACT

A testing unit for testing the lighting of truck tractors and trailers wherein the tester can be alternately connected to the truck or the tractor and when connected to the tractor a battery in the tester provides power to energize the various circuits in the trailer such as left turn signal, right turn signal, stop lights, tail and marker lights, auxiliary feed and ground. When the tester is connected to the trailer connector of the tractor, various accessories on the tractor are turned on such as the tail lights, turn signals, stop lights, etc. and the indicator lights on the tester will light and correspond to the accessories turned on in the tractor. The tester can also check itself by attaching the negative and positive leads to a 12 volt battery and attaching the male trailer connector of the tester harness to the female connector of the tester by flipping the toggle switches to the ON position. Indicator lights of the tester will light up corresponding to the toggle switches. Thus, the present invention allows trailers and tractors to be tested wihtout being connected to each other.

1 Claim, 5 Drawing Figures

TEST PANEL FOR TRACTOR AND TRAILER LIGHTS

BACKGROUND OF THE INVENTION

1. Field of the Invention

This invention relates in general to testing apparatus and in particular for a tester for tractor and trailer lighting systems.

2. Description of the Prior Art

Previously when a truck was connected to a tractor the lighting cable of the trailer had to be connected to the truck and all of the truck switches had to be energized so as to test the operation of the trailer lighting system. Since in large eighteen wheel trailers and truck tractors, there are many lights to be tested. This is a time consuming job.

SUMMARY OF THE INVENTION

The present invention comprises a testing device which can be connected to the trailer electrical cable when it is not connected to a truck tractor and the various lighting circuits of the trailer can be tested such that when a tractor comes to pick up the trailer, it will be known that all of the lighting circuits are operational and satisfactorily operating so that a test will not have to be made before the truck drives off with the trailer. The tester can also be used to test the lighting circuits in the tractor when it is not connected to the trailer and, thus, this test can be made when desired.

The tester can also be connected so as to test its own internal circuitry to assure that it is working properly.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

The present invention is to test the lighting of truck tractors and trailers. In order to test the trailer lighting only, the two battery terminals are connected to a battery as, for example, a 12 volt battery with the proper polarity depending on the system ground. The male trailer connector is installed from the tester to the female connector of the trailer. Then the ground toggle switch is moved to the on position and if the toggle switch lights then the trailer ground is good and testing can be started. The present invention illustrates six toggle switches one for left turn, one for right turn, one for stop, one for tail and marker lights, one for auxiliary circuit and one for ground circuit. In order to test the trailer lighting, the toggle switch is moved to the ON position and the rear lights on the trailer are viewed to see if they are on. The trailer lights should light and correspond to the particular toggle switch which has been moved to the ON position. If the trailer lights do not light when the toggle switch of the tester is in the ON position then there is a problem in the circuit. If all lights operate with the toggle switches on, the trailer is ready to be used.

To test the trailer connector of the tractor attach the battery leads to the battery with the proper polarity. The tractor unit has six indicator lamps, one for left turn, one for right turn, one for stop light, one for tail and marker lights, an auxiliary and ground. The male trailer connector of the tractor is inserted into the female connector of the testing device and if the ground indicator lamp lights, then the ground at the trailer connector of the tractor is good and testing can commence.

The accessories of the tractor are turned ON such as the tail lights, the turn signals, the stop lights, etc. and the indicator lamps on the tester will light up and correspond to the accessories turned on in the tractor. If all indicators light, the tractor is ready for use.

The tester can also check itself by simply attaching the positive and negative leads to the 12 volt battery and attaching the male trailer connector of the tester harness to the female connector of the tester; close the toggle switches to the ON position and indicator lamps of the tester should light and correspond to the toggle switches.

Figure 1:
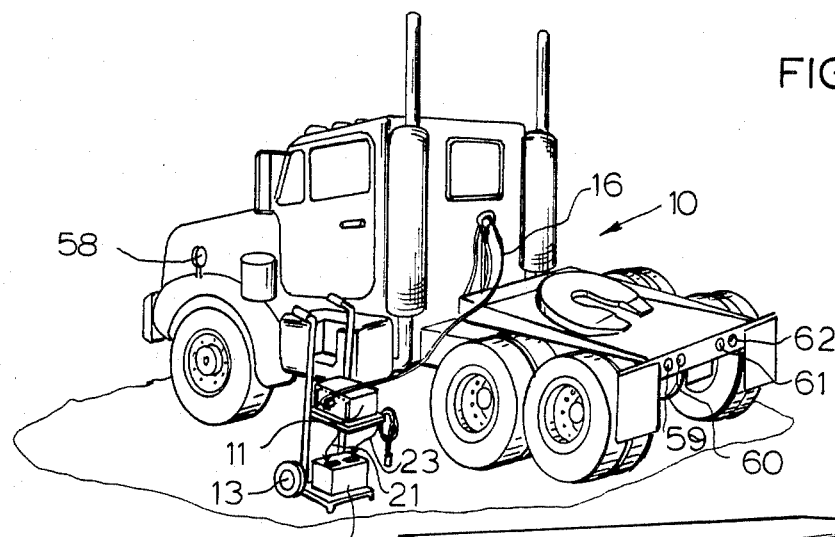
FIG. 1 is a perspective view of the tester connected to a truck tractor.

FIG. 1 illustrates the truck tractor 10 which has a cable 16 for connecting the electrical circuit of the tractor to a trailer and for testing the tractor the electrical cable 16 is inserted into the tester 11 receptacle 31. The tester 11 is carried on a cart 13 and has a pair of leads 21 and 23 which are connected to the battery terminals of the battery 12.

Figure 2:
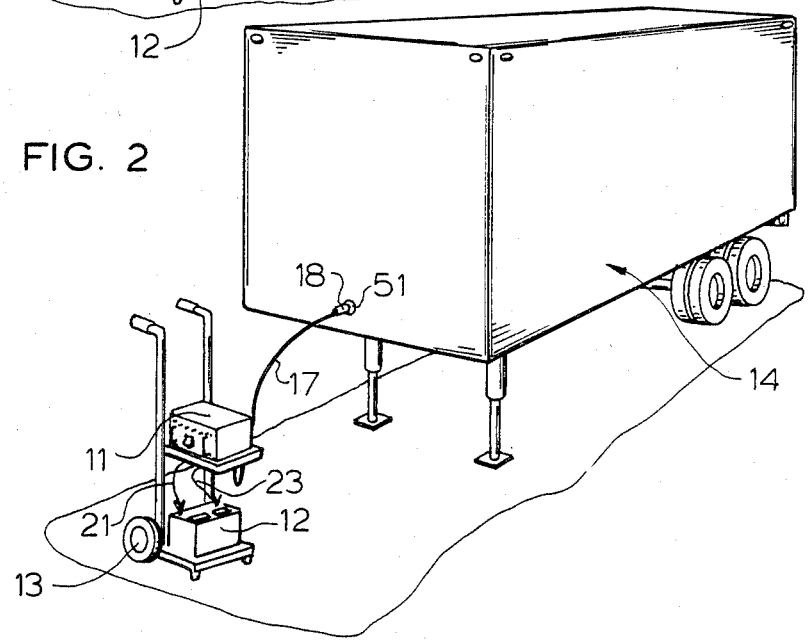
FIG. 2 is a perspective view of the tester connected to a truck trailer.

FIG. 2 illustrates the tester 11 connected to the female socket 51 of the trailer with the cable 17 of the tester 11 inserted into the connector 51.

Figure 3:
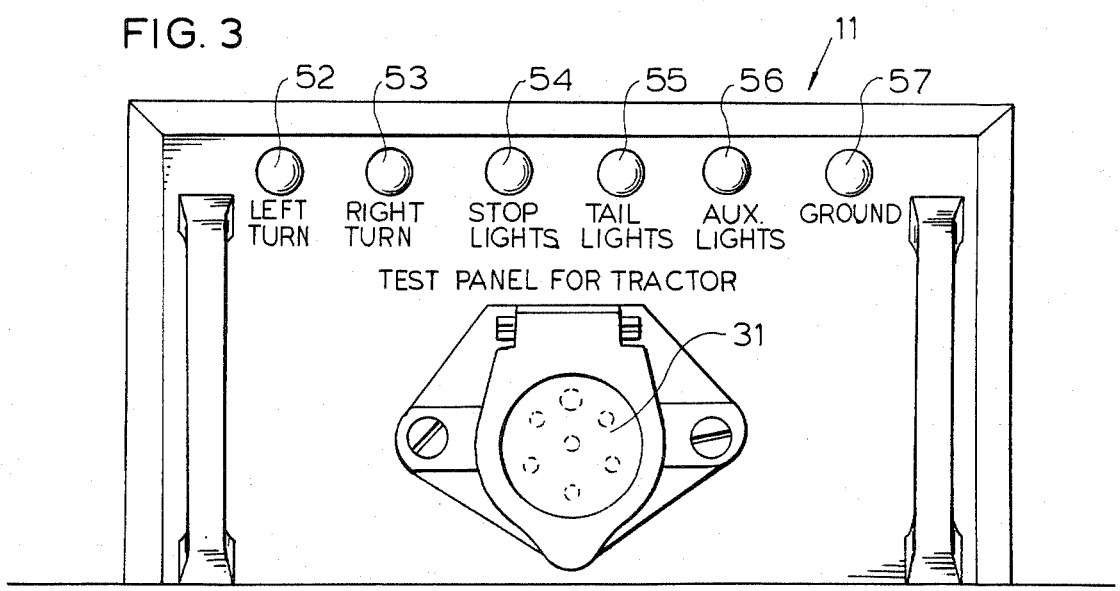
FIG. 3 is a plan view of the rear panel of the tester.
Figure 4:
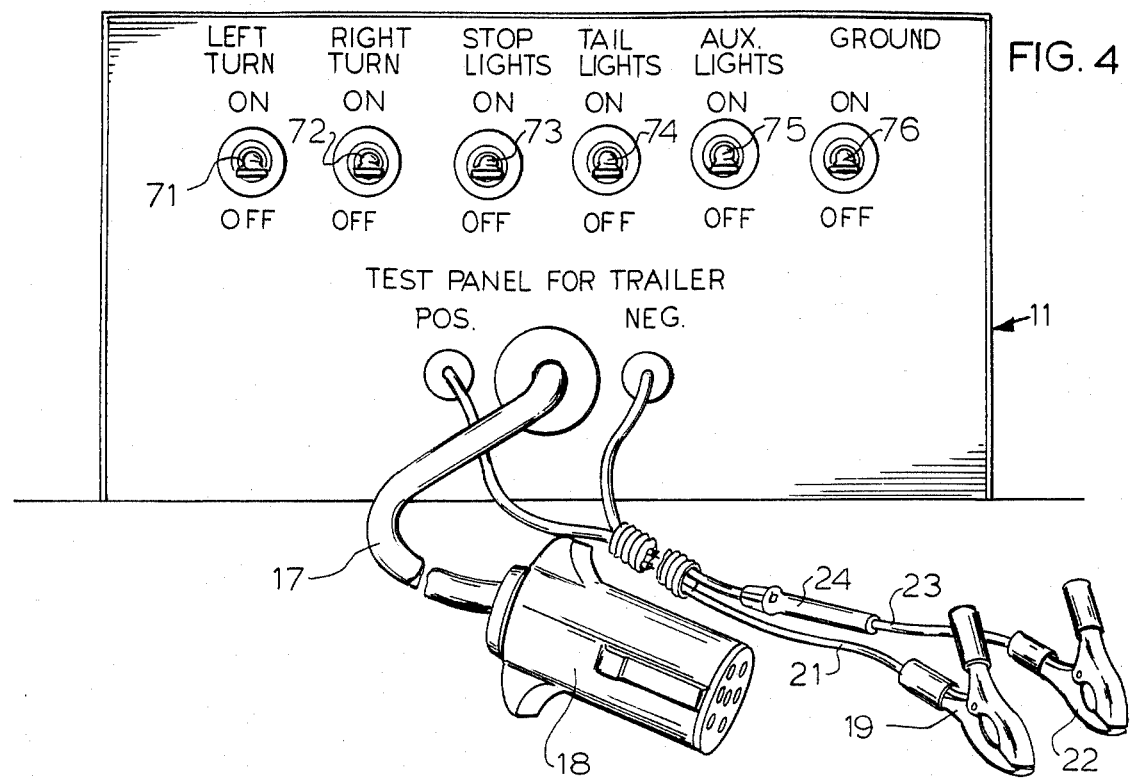
FIG. 4 is a plan view of the front of the tester showing the panel for testing the trailer.

FIGS. 3 and 4 are plan views of the tester 11 and FIG. 3, for example, illustrates the female connector 31 of the tester to which the cable 16 and the associated connector of the tractor are inserted and indicator lights 52 through 57 are mounted on the rear of the tester so as to indicate the various tests for the tractor. For example, the light 52 indicates left turn, the light 53 indicates right turn, the light 54 indicates stop lights, the light 55 indicates tail lights, the light 56 indicates auxiliary lights and the light 57 is a ground indicating light. On the truck for example, there is a left turn light 58 and a right turn light not shown, tail lights 60 and 61 and stop lights 59 and 62. A number of auxiliary lights are also provided on the truck.

FIG. 4 illustrates the front test panel of the tester 11 for a trailer and has the leads 21 and 23 with alligator clamps 19 and 22 for connecting to the terminals of a battery. The lead 23 may have a fuse 24 mounted therein. A number of toggle switches 71 through 76 are illuminated toggle switches in that their handles are illuminated. The switch 71 corresponds to the left turn signal on. The trailer signal switch 72 corresponds to the right turn switch on the trailer. Switch 73 corresponds to the stop lights, switch 74 corresponds to the tail lights, switch 75 corresponds to the auxiliary lights and switch 76 corresponds to the ground test.

Figure 5:
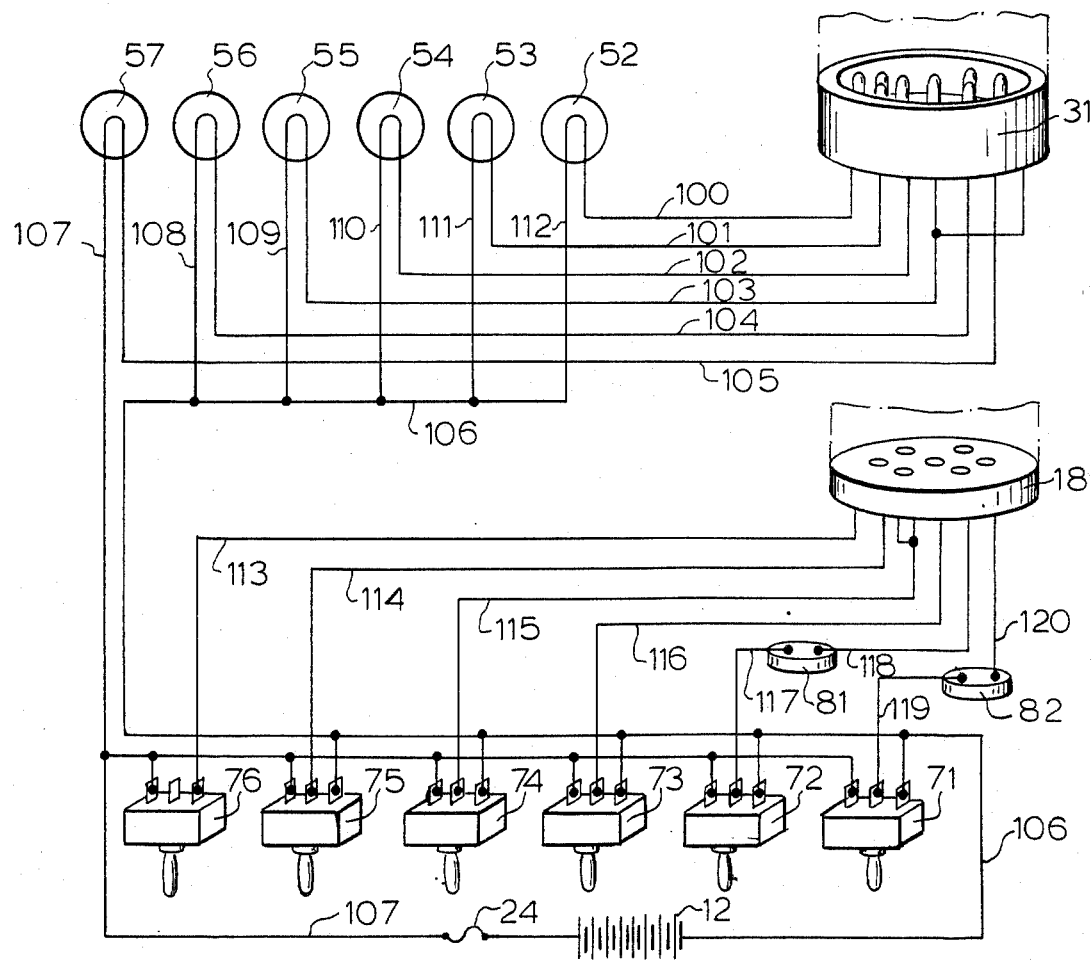
FIG. 5 is an electrical schematic of the tester.

FIG. 5 comprises the electrical schematic of the tester and shows the lights 52 through 57 with first sides connected by leads 100 through 105 to the various terminals of the female connector 31 which has a plurality of associated male prongs, not numbered connected to the various leads 100 through 105. The other sides of lights 52 through 56 are connected to lead 106 which is the negative terminal of the battery 12. The second side of light 57 is connected to lead 107 which is connected through a fuse 24 to the positive terminal of the battery 12. The lead 107 is also connected to one terminal of each of the switches 71 through 76 and lead 113 is connected from the ground switch 76 to the connector 18. The lead 106 is connected to one of the three terminals of the switches 71 through 75 and lead 119 is connected from the center terminal of switch 71 to a flasher 82 which has its other side connected to the connector 18 by lead 120. The middle terminal of switch 72 is connected by lead 117 to a flasher 81 which has its other side connected by lead 118 to the connector 18. The center connector of switch 73 is connected by lead 116 to the connector 18. The center terminal of switch 74 is connected by lead 115 to the connector 18 and the center terminal of switch 75 is connected by lead 114 to the connector 18.

In use for testing the trailer lighting, the leads 106 and 107 are connected to the 12 volt battery and the female trailer connector 51 of the trailer is connected to the male connector 18 of the tester 11. Move the ground toggle switch 76 to the ON position and if the light in the toggle switch 76 lights up then the ground in the trailer is good and testing can commence. Each of the other switches 71 through 75 test different light circuits in the trailer and to test them you merely move the toggle switch to the ON position and then view the rear lights on the trailer. For example, when the left turn switch 71 is turned to the ON position, the left turn light on the rear of the trailer should flash. When the right turn switch 72 is turned on, the right turn signal on the rear of the trailer should flash. When the switch 73 is turned on, the stop lights on the rear of the trailer should turn on. When the tail light switch 74 is turned on the tail lights should be turned on on the rear of the trailer. The auxiliary lights on the trailer are turned on when the switch 75 is moved to the ON position.

If all of the lights light up as the switches 71 through 76 are turned on and if all of the associated lights on the trailer properly operate, than the trailer lighting circuit is in working order.

If the trailer lights do not light up when the toggle switch of the tester is on the on position, then there is a problem in that particular circuit which can be corrected before using the trailer.

To test the trailer connector of the tractor, the leads 21 and 23 are connected to the battery and the male connector of the tractor is inserted into the female connector 31 of the tester. If the ground indicator light 57 lights up, then the ground at the trailer connector of the tractor is good and testing can commence. The accessories of the tractor are turned on such as the tail lights, turn signals, stop lights, auxiliary lights, left and right turn lights and if all indicators light, then the tractor is ready for use.

For testing the tester itself attach the negative and positive leads to the 12 volt battery and attach the female trailer connector 31 to the male connector 18. By turning the switches 71 through 76 to the ON position, the indicator lights should light up and correspond to the toggle switches.

It is seen that this invention provides a new and novel testing device for tractors and trailers and although it has been described with respect to preferred embodiments it is not to be so limited as changes and modifications can be made which are within the full intended scope as defined by the appended claims.

I claim as my invention:

1. A tester for testing the electrical systems on trailers and tractors which can be electrically interconnected by a cable comprising, a housing with a first connector terminal with a number of electrical circuits for receiving the end of the tractor cable therein, a first plurality of test indicators mounted in the housing and electrically connected to said first connector terminal such that as the various electrical circuits of said tractor are closed in the tractor cab said first plurality of test indicators will be energized to indicate that the associated tractor circuit is properly operating, including a pair of battery terminals connected to said housing for connecting it to a battery, including a cable connected to said housing and with a second connector which can be connected to an electrical receptacle of a trailer and a plurality of switches connected to said battery and said second connector for testing various electrical circuits in the trailer, and including a second plurality of test indicators associated with said plurality of switches to indicate when said switches are on including a flasher connected between one of said plurality of switches and said second connector, wherein said first plurality of test indicators are electrical lights, wherein said second plurality of test indicators are electrical lights, wherein said plurality of switches have at least partially transparent actuators and said second plurality of test indicators mounted in said actuators, wherein said plurality of switches each contain said test indicators, and wherein said second connector can be connected to said first connector terminal for allowing the test circuits of said tester to be tested.

* * * * *